United States Patent [19]

Sweet

[11] 4,051,434
[45] Sept. 27, 1977

[54] DIGITAL FREQUENCY MEASURING CIRCUITRY

[75] Inventor: Douglas W. Sweet, Flint, Mich.

[73] Assignee: General Motors Corporation, Detroit, Mich.

[21] Appl. No.: 690,848

[22] Filed: May 28, 1976

[51] Int. Cl.² .......................................... G01R 23/02
[52] U.S. Cl. .................................. 324/78 D; 324/166
[58] Field of Search ............... 324/78 D, 101, 186, 324/173, 178, 174, 166, 162, 163; 328/5, 161

[56] References Cited

U.S. PATENT DOCUMENTS

| 3,530,382 | 9/1970 | Liston et al. | 324/166 |
| 3,928,797 | 12/1975 | Kiencke | 324/78 D |
| 3,935,537 | 1/1976 | Batchelor | 324/166 |

Primary Examiner—M. Tokar
Attorney, Agent, or Firm—Albert F. Duke

[57] ABSTRACT

Circuitry for developing a binary number proportional to the frequency of an input signal includes a first and second shift register and an adder. Timing control circuitry establishes a 16 bit computation period and also develops a fixed binary number. Circuit means are provided for interconnecting the adder and the first register for increasing the content of the register by the fixed binary number once each cycle of the input signal and for reducing the content of the register by a fixed proportion each of the computation periods occurring during each cycle of the input signal. The content of the first register is transferred to the second or buffer register each cycle of the input signal and display means are provided for displaying the input frequency of a function as the binary number contained in the second register.

6 Claims, 5 Drawing Figures

DIGITAL FREQUENCY MEASURING CIRCUITRY

This invention relates to circuitry for measuring the frequency of an input signal and more particularly to digital circuitry for measuring the frequency of relatively low information rate input signals.

Many of the automobiles manufactured today are provided with a speed transducer which includes a two-pole magnet driven by a flexible cable attached to the vehicle transmission. The magnet cooperates with a speed cup to drive an indicator needle relative to a dial to indicate the speed of the vehicle. There have been numerous proposals in the prior art to replace this mechanical speedometer with an electrical speedometer of the analog or digital type.

One prior art analog frequency measuring circuit includes an operational amplifier with a parallel connected resistor and capacitor interconnecting the output and negative input. A pulse differentiator is connected to the positive input. This circuit has found extensive use in speed measuring and speed control systems. One prior art digital frequency measuring circuit converts a variable frequency pulsating input to a proportional binary word by counting the number of pulses occurring during a fixed period of time. This approach requires a high information rate in order to obtain a reasonable degree of resolution within a fixed time frame. Another digital method employed in the prior art is to measure the time between pulses and utilize the inverse of this quantity as an indication of the input frequency. The resolution obtained using this method is quite good for low input frequencies but the logic required to implement the inversion algorithm is substantial and cost is correspondingly high.

One of the problems of adapting electrical frequency measuring circuitry to automotive applications such as speedometer, tachometer, and speed control involves the speed transducer that is to provide an electrical signal indicative of the speed of the vehicle. In order to get the necessary resolution, prior art digital speed measuring and control systems, have usually required a specially designed speed transducer or sender which included a multi-toothed wheel. The wheel, which may have as many as 360 teeth, is rotated at a rate proportional to the speed of the vehicle or to the speed of some component of the vehicle. The large number of pulses produced by the multi-toothed wheel during a given time interval produce relatively high resolution but such a sensor is relatively expensive and represents a substantial portion of the total cost of the speed measuring or control system.

It would be desirable from a cost standpoint if the speedometer cable presently on the vehicle could be used as the drive means for producing an electrical signal proportional to the speed of the vehicle. However, this cable rotates at 1,000 rpm at 60 mph. If the rotation of the two-pole magnet or the two-pole field plate attached to and driven by this cable is detected, the resultant pulsating signal occurs at a rate of 0.5555 Hz/mph which is a relatively low information rate.

With the foregoing in mind it is an object of the present invention to provide digital frequency measuring circuitry in which a high degree of resolution can be obtained from a low information rate sender using a minimum number of logic elements.

It is another object of the present invention to provide digital frequency measuring circuitry particularly suitable for automotive applications such as speedometer, tachometer, wheel lock control and speed control.

In accordance with the present invention, digital frequency measuring circuitry is provided which utilizes a minimum of logic elements but nevertheless provides a high resolution output for a low information rate input. The digital circuitry of the present invention is functionally equivalent to the analog frequency measuring circuit mentioned above. The digital circuitry includes a serial adder having an output connected to the input of a 16 bit serial shift register. The output of the shift register is connected with one input of the adder. The content of the register is continuously circulated through the adder and is modified in accordance with the data applied to the second input of the adder. A timing generator driven from a basic clock provides the necessary timing for shifting data through the register, establishing a computational cycle and generating a predetermined serial binary word or constant. The normal mode of operation for the shift register and adder is to subtract the upper six bits of the binary word contained in the register from itself. In other words, the content of the register is reduced by a fixed proportion of its present value. This operation is performed during each computation period and results in an exponential decline in the content or value of the binary word in the register. When a sender pulse, i.e. a pulse from the variable frequency input signal to be measured, is received the aforementioned predetermined binary word is added to the content of the register. This addition is performed during the first computation period following the generation of a sender pulse. The content of the register is thus increased by a fixed amount each time a pulse is received and decreases exponentially between pulses. Just prior to the addition of the predetermined binary word to the content of the register the value of the binary word contained in the register is shifted to a second register for storage. The continuous subtract mode of the digital tachometer performs the same function as the feedback network between the output and negative input of the operational amplifier in the aforementioned analog circuit and the addition of the constant term is analogous to the differentiated pulse supplied to the positive input of the operational amplifier.

A more complete understanding of the present invention may be had from the following detailed description which should be read in conjunction with the drawings in which.

Figure 1:
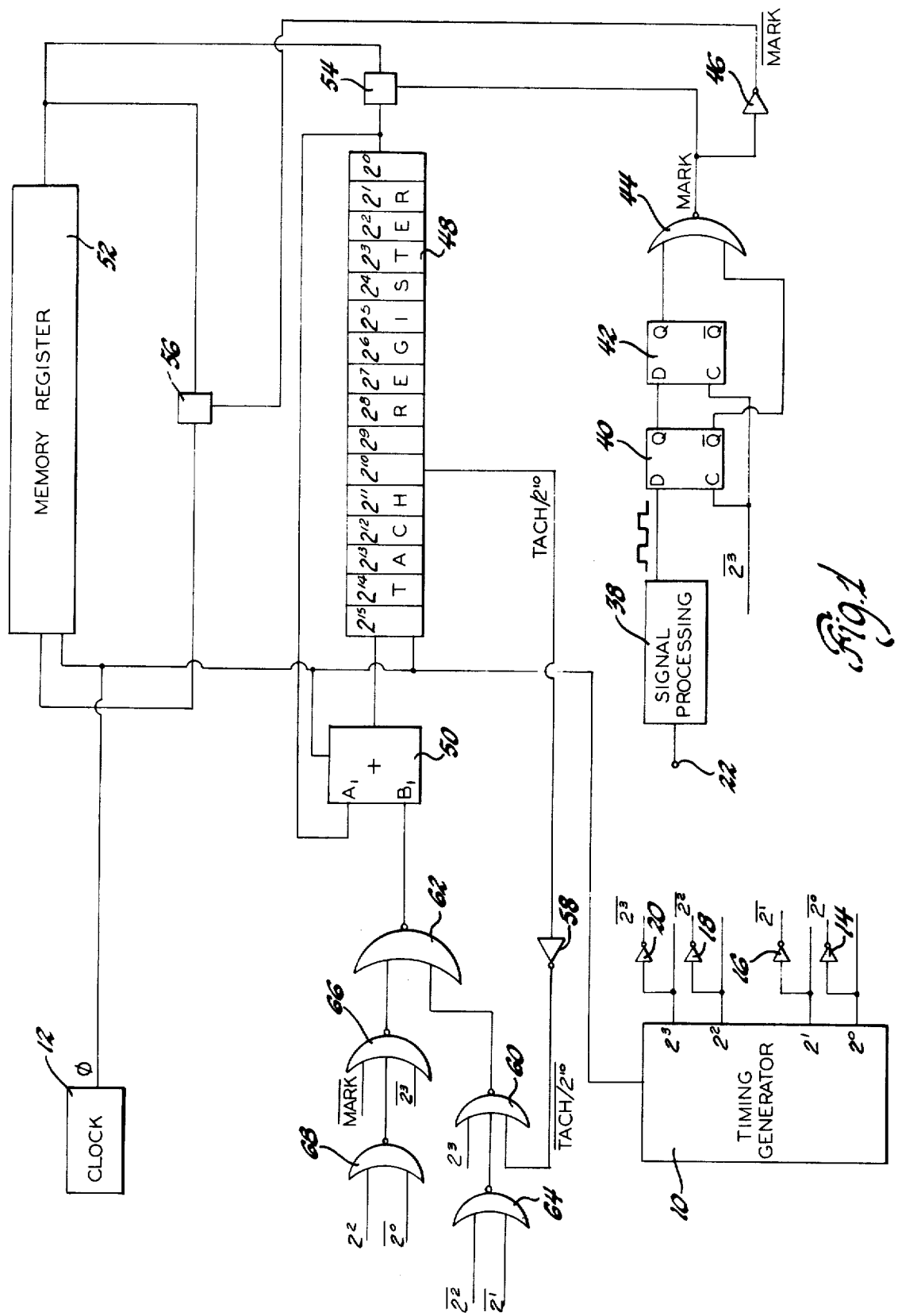
FIG. 1 is a schematic diagram of the frequency determining circuitry of the present invention.

Referring now to the drawings and initially to FIG. 1, a timing generator generally designated 10 receives an input 0 from a clock 12. Outputs of the timing generator 10 are designated $2^0$, $2^1$, $2^2$ and $2^3$ and the respective waveforms are shown in the timing diagram of FIG. 2. The $2^3$ output of the generator 10 establishes a fixed computation period of 16 bit times. The outputs of the timing generator 10 are applied to invertors 14, 16, 18 and 20 to provide the inverted outputs designated $\overline{2^0}$, $\overline{2^1}$, $\overline{2^2}$ and $\overline{2^3}$.

Figure 2:
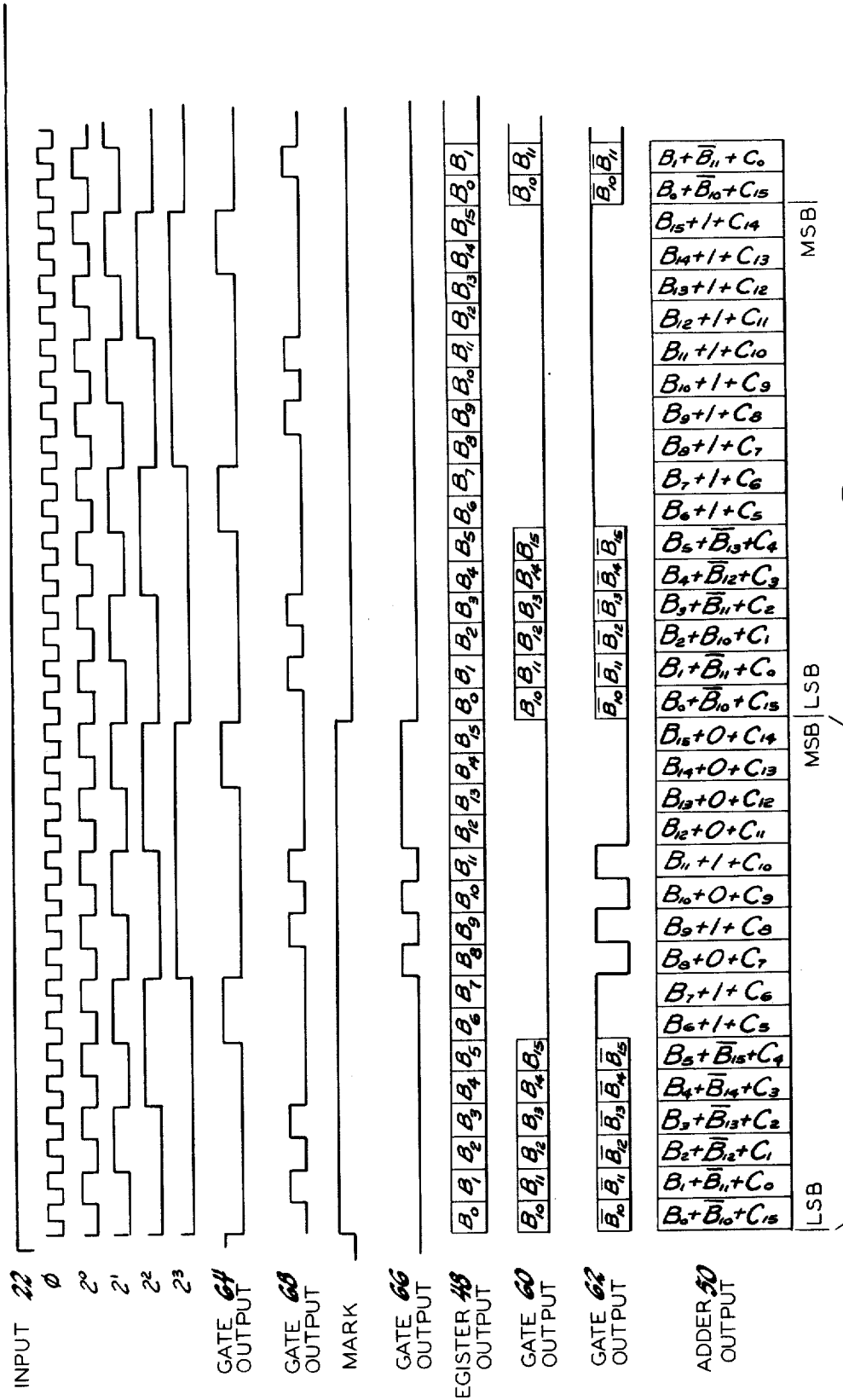
FIG. 2 is a timing diagram useful in understanding the operation of the circuit of FIG. 1.
Figure 3:
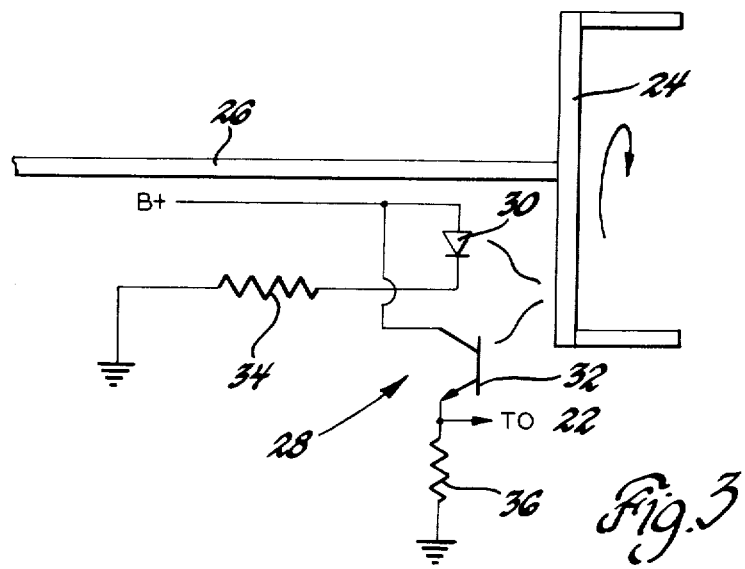
FIG. 3 is schematic representation of a speed transducer which may be used with the circuitry of FIG. 1.

The variable frequency input signal to be measured is applied to the input terminal 22. As shown in FIG. 3, the signal is preferably obtained from a two-pole field plate 24 which is driven by the speedometer cable 26 of the motor vehicle. An optoelectronic transducer generally designated 28 includes a light emitting diode 30 and a phototransistor 32 each of which are connected across a source of voltage through respective current limiting resistors 34 and 36. Light emitted from the diode 30 is reflected to the phototransistor 32 from each pole of the two-pole field plate 24 thereby producing a pulsating output of two pulses for each revolution of the speedometer cable 26. The signal is applied to signal processing circuitry generally designated 38 to produce an output which is essentially a square wave signal which is applied to the D input of flip-flop 40. A complete cycle of the input signal is not shown in FIG. 2 since the frequency of the input signal is much lower than the frequency of any of the signals shown in FIG. 2. For example, the frequency of the signal applied to the terminal 22 is approximately 33 Hz at 60 mph while the frequency of the clock signal C is 132 KHz. The Q output of the flip-flop 40 is connected to the D input of the flip-flop 42. Flip-flops 40 and 42 are clocked from the $2^3$ output of the timing generator 10. The Q output of the flip-flop 40 and the Q output of the flip-flop 42 are inputs to a NOR gate 44, the output of which is designated MARK. Thus, as shown in FIG. 2, the MARK signal goes high on the first leading edge of $2^3$ (falling edge of $2^3$) following the rising edge of the input signal and remains high for one complete cycle of $2^3$ which is 16 bits. The MARK output is applied through an invertor 46 to produce the signal designated MARK.

A sixteen bit shift register 48 has its input connected to the output of a serial adder 50. The output of the register 48 is connected with the input $A_1$ of the adder 50. The output of the register 48 is also connected with the input of a sixteen bid shift register 52 through a transmission gate 54 which is controlled from the signal MARK. The output of the register 52 is connected with its input through a transmission gate 56 which is controlled from the signal MARK. Data is shifted through the registers 48 and 52 and adder 50 by the clock 12. The content of the register 48 is continuously being circulated from output to the input through the adder 50 under control of the clock 12. The content of the register 48 is changed by the data appearing at the $B_1$ input of the adder 50 as will be explained hereinafter. On the rising edge of the MARK signal the data in the register 48 is serially shifted into the register 50. On the falling edge of the MARK signal, MARK rises so that thereafter the content of the register 52 is continuously circulated from output to input.

The tachometer algorithm implemented by the circuitry shown in FIG. 1 may be expressed as TACH = TACH − TACH/N + M where N and M are constants. The value of the constants depend on a number of factors including the size of the register 48, frequency of clock 12 and the desired time constant for the circuit. In the specific embodiment of FIG. 1, N = $2^{10}$ and M = 2,816. The constant M is added to the content of the register 48 each sender pulse, during the sixteen bit interval while MARK is high. The content of the register 48 is reduced by 1/N times the previous content of the register 48 each computation period. The exponential reduction in the content of the register 48 (TACH − TACH/N) is accomplished as follows. The individual memory elements of the register 48 are designated $2^0 - 2^{15}$. As is well known, each of the individual elements or flip-flops of the register 48 are interconnected so that data bits are shifted from one element to the next element by the clock 12. The register 48 may also be considered as two registers, the first comprising stages $2^{10} - 2^{15}$ and the second comprising stages $2^0 - 2^9$ with the output of the first register being connected to the input of the second register. The output of the memory element designated $2^{10}$ is designated TACH/$2^{10}$ and is applied through an invertor 58 to produce the complemented signal designated $\overline{TACH/2^{10}}$. $\overline{TACH/2^{10}}$ is applied to the $B_1$ input of the adder 50 through NOR gates 60 and 62. A second input of the NOR gate 60 is the output $2^3$ from the timing generator 10. A third input to the NOR gate 60 is the output of the NOR gate 64 whose inputs are the $2^1$ and $2^2$ outputs of the timing generator 10. As shown in the timing diagram in FIG. 2 the gate 60 is disabled by the $2^3$ output of the timing generator 10 during the bit times containing bits $B_8 - B_{15}$ of any 16 bit word. The output of the gate 64 disables the gate 60 during the bit times containing bits $B_6$ and $B_7$. Accordingly the complement of the six most significant bits $B_{10} - B_{15}$ of each TACH word is added to the six least significant bits $B_0 - B_5$ during $B_0$ through $B_5$. As shown in FIG. 2 each add operation includes the carry $C_n$ from the previous add operation.

The other input to the gate 62 is from the output of a NOR gate 66. The inputs to the NOR gate 66 are the $2^3$ output of the generator 10, the MARK output and the output of a NOR gate 68. The inputs of the NOR gate 68 are $2^2$ and $2^0$ outputs of the timing generator 10. The MARK input to the gate 66 disables the gate 66 except when MARK is low, i.e. when MARK is high. The $2^0$, $2^2$ and $2^3$ inputs to gates 68 and 66 produce a 16 bit serial binary word. This word is the constant M in the TACH algorithm and is applied to the $B_1$ input of adder 50 through gate 62 during the 16 bit computation period while MARK is high. Thereafter during each 16 bit computation interval while MARK is low, only the subtraction operation is performed.

Figure 4:
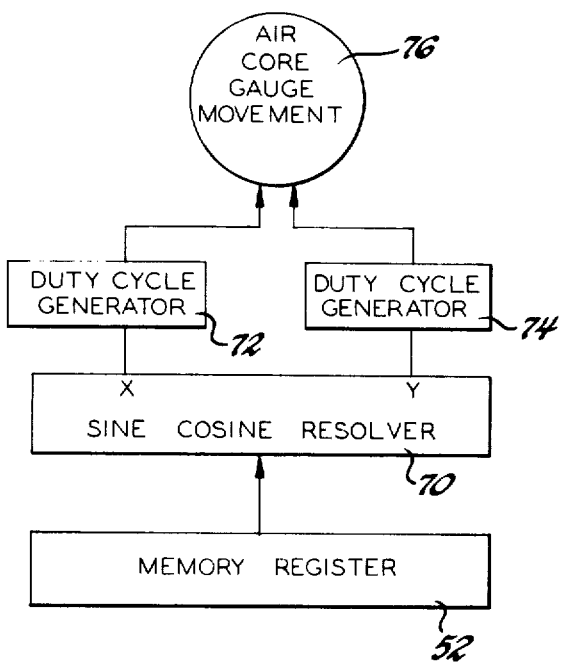
FIGS. 4 and 5 are block diagrams of analog and digital display systems respectively which may be used with the circuitry of FIG. 1.
Figure 5:
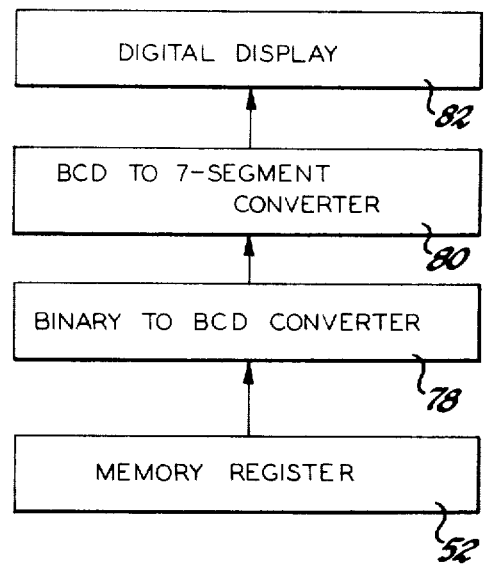

The content of the memory register 52 may be output in a serial or parallel fashion to provide an appropriately scaled analog or digital display of the content of the register 52. As shown in FIG. 4, the output of the register 52 is applied to a sine/cosine resolver 70 producing X and Y coordinate outputs which are converted from binary words to duty cycle modulated signals by duty cycle generators 72 and 74 and applied to an air core gauge movement 76 to produce an analog representation of the binary word contained in the register. As shown in FIG. 5, the output of the register 52, which is in binary form, is converted to a BCD format by a binary to BCD converter 78 and then to a 7-segment format by BCD to 7-segment converter 80 to drive a display 82 to provide a digital read out. Alternatively, the tachometer circuitry of FIG. 1 may be designed on a BCD format rather than binary format thereby alleviating the necessity for the converter 78.

Having thus described my invention, what I claim is:

1. Digital frequency measuring circuitry for developing a binary word related to the frequency of a pulsating input signal comprising a serial-in serial-out accumulator register, said accumulator register comprising first and second serial-in serial-out shift registers, the output of said first shift register being connected with the input of said second shift register, means for complementing the output of said first register for providing a complemented output, a single bit serial adder having first and second inputs and an output, said second input being connected with the output of said second shift register, said output of said adder being connected with the input of said first shift register, clock means for establishing a fixed computation cycle the frequency of which is substantially higher than the highest frequency input signal to be measured, means responsive to said clock means for developing a serial bit stream corresponding to a predetermined binary number, gate means having inputs connected with said complemented output of said first register and with said means for generating said binary number, said clock means controlling said gate means to connect the complemented output of said first register to said first input of said adder during a portion of each computation cycle said gate means also responsive to said pulsating signal for passing said predetermined binary number to said first input of said adder during at least one of the computation cycles occurring each cycle of said input signal, a serial-in serial-out memory register, means responsive to said input signal for transferring the word in said accumulator register to said memory register each cycle of said input signal, whereby the binary word stored in said accumulator register is increased by a constant amount each cycle of said input signal and said binay word is decreased by a predetermined proportion each computation cycle.

2. Digital frequency measuring circuitry for developing a binary number proportional to the frequency of an input signal comprising a first shift register, timing means for establishing a computation period which is substantially less than the shortest period of said input signal whereby a plurality of computations are performed each cycle of said input signal, means for increasing the binary number contained in said register by a predetermined amount during at least one of the computation periods occurring each cycle of said input signal, and for reducing the binary number contained in said register by a fixed proportion each computation period, a second shift register, means responsive to said input signal for entering the content of said first register into said second register each cycle of said input signal and display means for displaying the frequency of said input signal as a function of the content of said second register.

3. Digital frequency measuring circuitry for developing a binary number proportional to the frequency of an input signal comprising a first shift register, an adder, clock means, timing means responsive to said clock means for establishing a computation period which is substantially less than the period of said input signal, gate means responsive to said timing means for developing a fixed binary number, circuit means interconnecting said adder with said register for increasing the content of said first register by said fixed binary number, at least one of the computation periods occurring each cycle of said input signal and for reducing the binary number contained in said first register by a fixed proportion each computation period, second register means, gate means interconnecting the output of said first register with the input of said second register and responsive to said input signal for transferring the content of said first register to said second register during one of the computation periods occurring each cycle of said input signal, and display means for displaying the frequency of said input signal as a function of the binary number contained in said second register.

4. A digital frequency measuring system comprising speed sensor means for producing a variable frequency input signal, timing control means for establishing a fixed computation period which is substantially less than the shortest period of said input signal, computer means responsive to said input signal for developing a binary word proportional to the frequency of said input signal and including a serial-in serial-out binary shift register, said register having an input, a first output at the final stage of said register, and a second output at an earlier stage of said register, a serial binary adder having first and second inputs and an output, means connecting said first output of said register to said first input of said adder, means connecting the output of said adder to the input of said register, word generating means for generating a serial bit stream representing a constant binary word, gate means having inputs connected with said second output of said register and with said word generating means, said timing control means controlling said gate means to pass the bit stream at said second output of said register to the second input of said adder during a particular bit time interval each computation period and for passing said constant binary word to said second input of said adder once each cycle of said input signal, a serial-in serial-out memory register, means for transferring the binary word in said first register to said memory register once each cycle of said input signal, whereby the binary word stored in said first register is increased by a constant amount each cycle of said input signal and said word is decreased by a predetermined proportion of the word each computation period.

5. Digital frequency measuring circuitry for use on a motor vehicle having speed sensor means for producing sender pulses the frequency of which are related to the vehicle speed; said circuitry comprising timing control means for establishing a fixed computation cycle; computer means responsive to said sender pulses for developing a binary word related to the speed of said vehicle; said computer means including a first serial-in serial-out binary shift register; said first register having an input, a first output at the final stage of said register, and a second output at an earlier stage of said register; a serial binary adder having first and second inputs and an output; means connecting said first output of said register to said first input of said adder; means connecting the outputs of said adder to the input of said register; word generating means for generating a serial bit stream representing a constant binary word; gate means having inputs connected with said second output of said register and with said word generating means, said timing control means controlling said gate means to pass the bit stream at said second output of said register to the second input of said adder during a particular bit time interval each computation cycle and for passing said constant binary word to said second input of said adder during at least one of the computation cycles occurring between sender pulses; whereby the binary word stored in said first register is increased by a constant amount each time a sender pulse is generated and said word is decreased by a predetermined porportion of the word each computation cycle; a serial-in serial-out memory register; means responsive to a sender pulse for transferring the word in said first register to said memory register, and display means responsive to the binary word stored in said memory register for displaying the speed of said vehicle.

6. Digital frequency measuring circuitry for developing a binary number proportional to the frequency of an input signal comprising a first shift register, timing means for establishing a computation period which is substantially less than the shortest period of said input signal whereby a plurality of computations are performed each cycle of said input signal, means for increasing the binary number contained in said register by a predetermined amount during at least one of the computation periods occurring each cycle of said input signal, and for reducing the binary number contained in said register by a fixed proportion each computation period, a second shift register, means responsive to said input signal for entering the content of said first register into said second register each cycle of said input signal.

* * * * *